United States Patent
Boecker et al.

(10) Patent No.: US 12,019,494 B2
(45) Date of Patent: Jun. 25, 2024

(54) DOMAIN CLOCK AND POWER ACTIVATION CONTROL CIRCUIT TO REDUCE VOLTAGE DROOP AND RELATED METHODS

(71) Applicant: Microsoft Technology Licensing, LLC, Redmond, WA (US)

(72) Inventors: Charles Boecker, Ames, IA (US); Eric Groen, Ankeny, IA (US); Shaishav A. Desai, San Jose, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 13 days.

(21) Appl. No.: 17/853,258

(22) Filed: Jun. 29, 2022

(65) Prior Publication Data

US 2024/0004449 A1 Jan. 4, 2024

(51) Int. Cl.
*G06F 1/32* (2019.01)
*G06F 1/04* (2006.01)
*G06F 1/3206* (2019.01)
*G06F 1/3296* (2019.01)

(52) U.S. Cl.
CPC .............. *G06F 1/3206* (2013.01); *G06F 1/04* (2013.01); *G06F 1/3296* (2013.01)

(58) Field of Classification Search
CPC ......... G06F 1/3206; G06F 1/04; G06F 1/3296
See application file for complete search history.

(56) References Cited

U.S. PATENT DOCUMENTS 9,780,644 B1  10/2017  Tapadia et al.
9,785,211 B2  10/2017  Koob et al.
2010/0097101 A1  4/2010  Chua-eoan et al.
2013/0262895 A1  10/2013  Kayama
2014/0208142 A1*  7/2014  Tamura ................. G06F 1/3275
                                                                    713/322
2016/0259396 A1  9/2016  Nishimura

FOREIGN PATENT DOCUMENTS

GB           2532210 A      5/2016

OTHER PUBLICATIONS

"International Search Report and Written Opinion Issued in PCT Application No. PCT/US23/022627", dated Oct. 5, 2023, 11 Pages.

* cited by examiner

*Primary Examiner* — Stefan Stoynov
(74) *Attorney, Agent, or Firm* — Withrow & Terranova, PLLC

(57) ABSTRACT

A domain control circuit includes a power regulator to supply power for a first domain on a power rail and a sequencing circuit to control the power regulator, and a clock gate signal to activate the domain. The sequencing circuit receives a domain control signal to control activation and deactivation of the domain. The domain control circuit deactivates the clock gate signal to the domain after controlling the power regulator to supply power for the domain on a power rail. In this manner, a voltage droop in a supply voltage on a power rail is reduced. In some examples, the clock gate signal to the domain is deactivated after a voltage increase on the power rail. In some examples, the power regulator includes a plurality of parallel regulator circuits and a regulator control circuit to determine a number of the parallel regulator circuits to be activated to power the domain.

21 Claims, 4 Drawing Sheets

DOMAIN CLOCK AND POWER ACTIVATION CONTROL CIRCUIT TO REDUCE VOLTAGE DROOP AND RELATED METHODS

FIELD OF THE DISCLOSURE

The technology of the disclosure relates in general to managing power in integrated circuits (ICs) and in particular to reducing a voltage droop upon activation of logic circuits in a clock domain of an IC.

BACKGROUND

Integrated circuits (ICs) include digital and analog circuits that provide functional capabilities for a wide variety of electronic devices. Digital circuits include logic circuits that are synchronized by clock signals distributed through a clock tree. The logic circuits synchronized to one clock signal are included in a same domain. An IC may have multiple domains, each controlled by its own clock and capable of intercommunication with each other when the clocks are synchronized. Even when logic circuits are not being used, they continue to consume power as long as they receive power and their clock signal continues to be active. To preserve power in an IC, one or more domains may be shut off when the function(s) performed by the logic circuits in the domain are not in use. One or more domains in an IC can be shut off by deactivating the clock signal to the domain(s). This can be achieved by activating a clock gate signal to gate (e.g., block) a root clock signal provided to a domain clock tree for distribution throughout the domain. When a function of the logic circuits in the clock domain is again needed, the clock signal to the domain can be activated by deactivating the clock gate signal. As all the logic circuits in the clock domain start to be clocked again, a sudden surge in power consumption in the domain causes a voltage droop on a power rail of a power distribution network in the IC. The voltage droop can slow down the performance of the logic circuits and may even cause logic errors.

SUMMARY

Exemplary aspects disclosed herein include domain clock and power control circuits for reducing voltage droop. Related methods of reducing voltage droop are also disclosed. Digital circuits in an integrated circuit may be divided into different domains with their own clock signal. When not in use, a domain may be deactivated to minimize power consumption by deactivating a domain clock signal. An exemplary domain control circuit includes a sequencing circuit to control a clock gate signal that gates a domain clock signal of a first domain and controls a power regulator that supplies power for the first domain on a power rail. The sequencing circuit receives a domain control signal to control activation and deactivation of the domain. The domain control circuit deactivates the clock gate signal to the domain after controlling the power regulator to supply power for the domain on a power rail. In this manner, a voltage droop in a supply voltage on a power rail is significantly reduced or avoided. In some examples, the clock gate signal to the domain is deactivated after a voltage increase on the power rail. In some examples, the power regulator includes a plurality of parallel regulator circuits and a regulator control circuit to determine a number of the parallel regulator circuits to be activated to power the domain. In some examples, the domain control signal is provided to the domain control circuit from an always-on domain that remains active during a low-power mode.

In exemplary aspects disclosed herein include a domain control circuit comprising a power regulator comprising at least one regulator circuit configured to supply power on a power rail for a first domain of an integrated circuit (IC). The domain control circuit also comprises a sequencing circuit configured to receive a domain control signal indicating one of activation and deactivation of the first domain. The sequencing circuit is further configured to, in response to the domain control signal indicating activation of the first domain, generate a power control signal to control the at least one regulator circuit to supply power on the power rail for the first domain and generate a clock gate signal in a first state to activate a clock signal in the first domain after generating the power control signal to control the at least one regulator circuit to supply power on the power rail for the first domain.

In another exemplary aspect, a system comprising an IC comprising a first domain comprising a chip-to-chip interface circuit and a domain control circuit. The domain control circuit comprises a power regulator comprising at least one regulator circuit configured to supply power on a power rail for a first domain of an IC. The domain control circuit comprises a sequencing circuit configured to receive a domain control signal indicating one of activation and deactivation of the first domain. The sequencing circuit is configured to, in response to the domain control signal indicating activation of the first domain, generate a power control signal to control the at least one regulator circuit to supply power on the power rail for the first domain and generate a clock gate signal in a first state to activate a clock signal in the first domain after generating the power control signal to control the at least one regulator circuit to supply power on the power rail for the first domain. The system further comprises a clock distribution circuit configured to receive the clock gate signal, receive a system clock signal, and distribute the chip clock signal to the first domain based on the clock gate signal.

In another exemplary aspect, a method of controlling a first domain of an IC is disclosed. The method comprises supplying, by a power regulator comprising at least one regulator circuit, power on a power rail for a first domain of an IC and receiving, in a sequencing circuit, a domain control signal indicating one of activation and deactivation of the first domain. The method also comprises, in response to the domain control signal indicating activation of the first domain, generating a power control signal to control the at least one regulator circuit to supply power on the power rail for the first domain and generating a clock gate signal in a first state to activate a clock signal in the first domain after generating the power control signal to control the at least one regulator circuit to supply power on the power rail for the first domain

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

Figure 1:
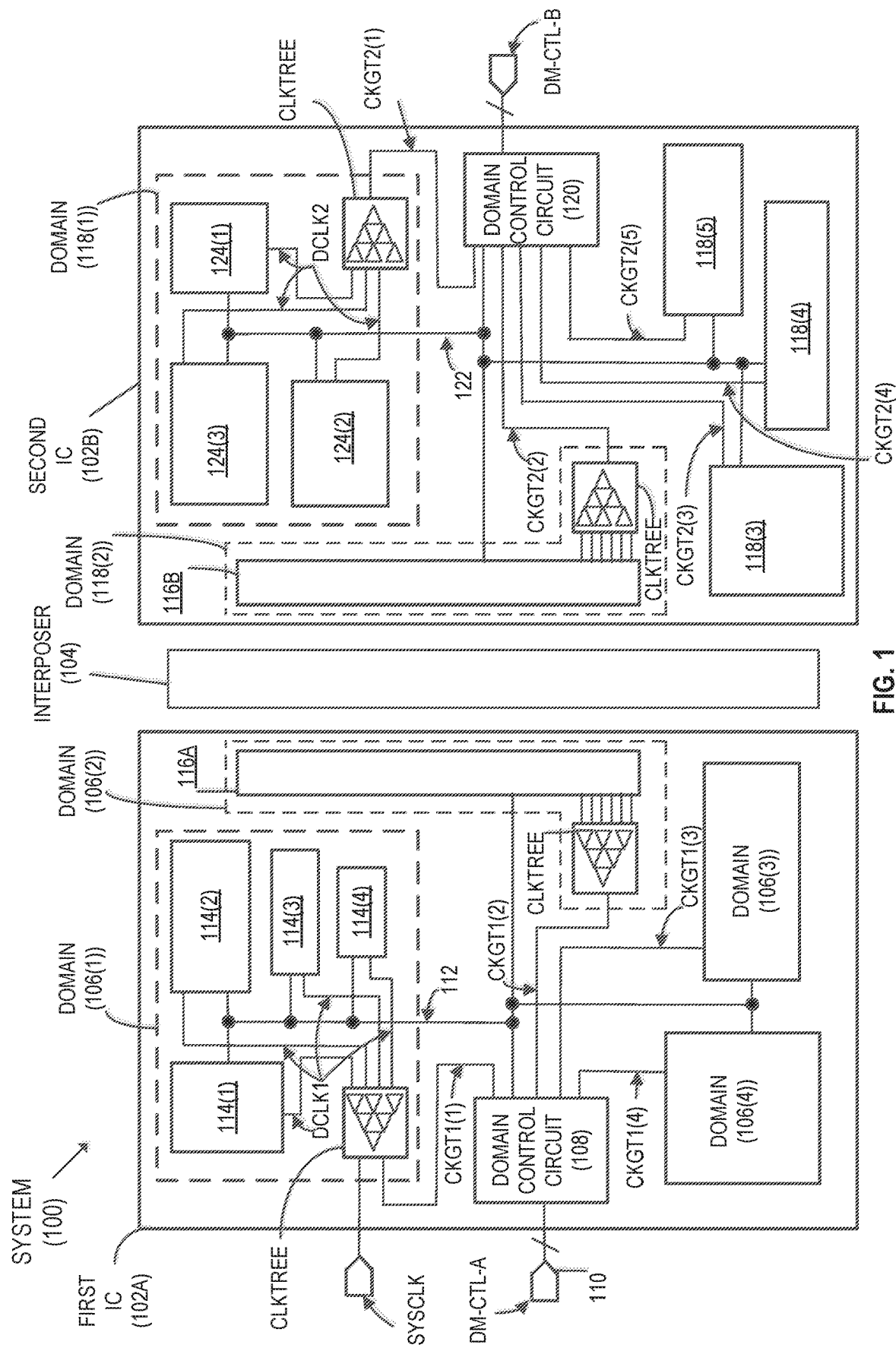
FIG. 1 is a schematic diagram of a system including two integrated circuits (ICs) that communicate with each other, and each includes a domain control circuit to provide a low latency activation of an interface without reduced voltage droop.

With reference to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Exemplary aspects disclosed herein include domain clock and power control circuits for reducing voltage droop. Related methods of reducing voltage droop are also disclosed. Digital circuits in an integrated circuit may be divided into different domains with their own clock signal. When not in use, a domain may be deactivated to minimize power consumption by deactivating a domain clock signal. An exemplary domain control circuit includes a sequencing circuit to control a clock gate signal that gates a domain clock signal of a first domain and controls a power regulator that supplies power for the first domain on a power rail. The sequencing circuit receives a domain control signal to control activation and deactivation of the domain. The domain control circuit deactivates the clock gate signal to the domain after controlling the power regulator to supply power for the domain on a power rail. In this manner, a voltage droop in a supply voltage on a power rail is significantly reduced or avoided. In some examples, the clock gate signal to the domain is deactivated after a voltage increase on the power rail. In some examples, the power regulator includes a plurality of parallel regulator circuits and a regulator control circuit to determine a number of the parallel regulator circuits to be activated to power the domain. In some examples, the domain control signal is provided to the domain control circuit from an always-on domain that remains active during a low-power mode.

Figure 2:
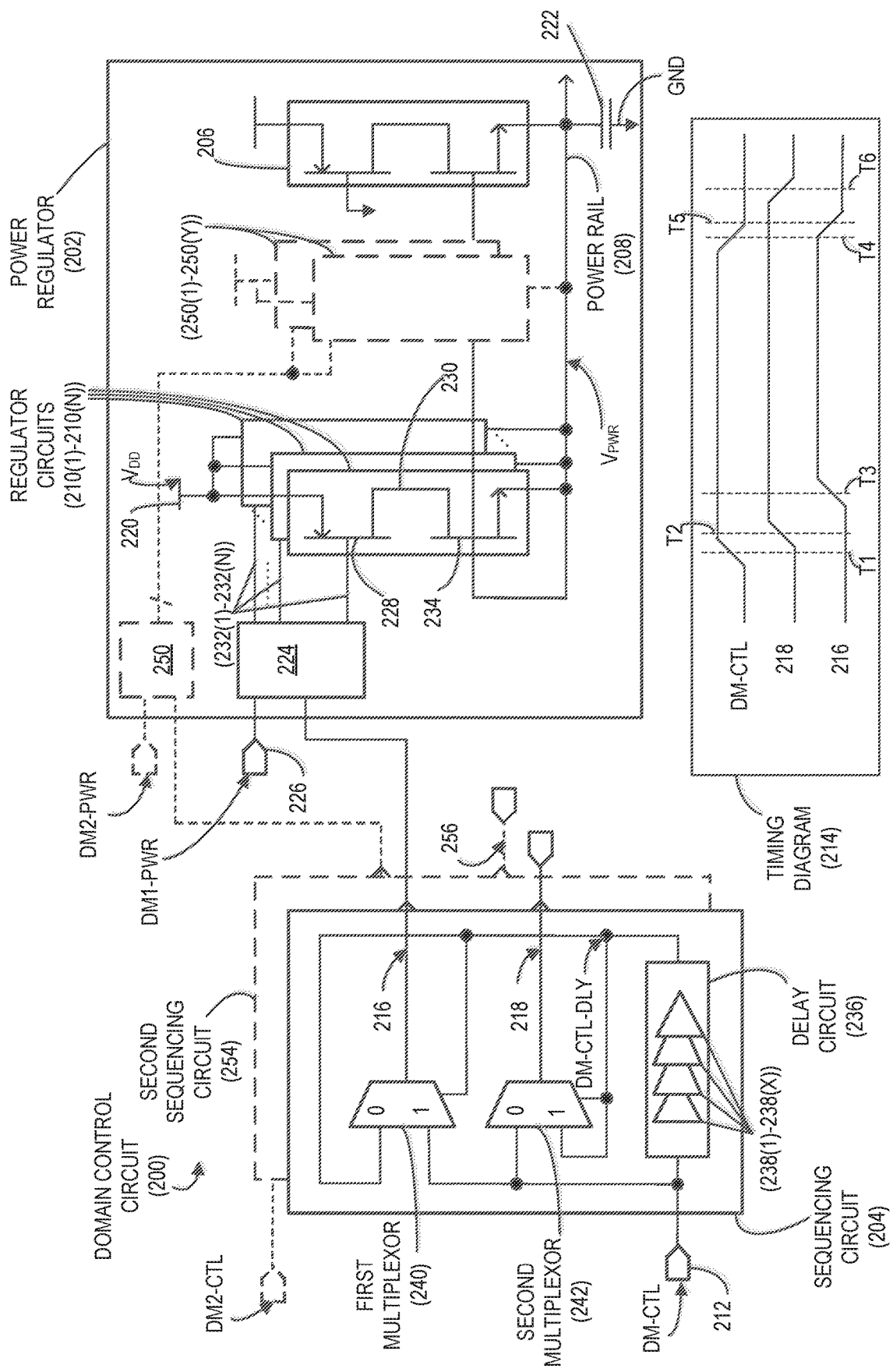
FIG. 2 is a schematic diagram of a domain control circuit, including a power regulator and a sequencing circuit to reduce a voltage droop upon activation of a domain of an IC.

Before describing details of an exemplary domain control circuit 200 in FIG. 2, a system 100, in which the exemplary domain control circuit 200 may be employed, is illustrated in FIG. 1. The system 100 includes a first IC 102A and a second IC 102B that communicate with each other. In the example in FIG. 1, the first IC 102A and the second IC 102B are each coupled to an interposer 104 that provides a medium for the transfer of signals between the first IC 102A and the second IC 102B. The first IC 102A includes a plurality of domains 106(1)-106(4) of digital circuits and an exemplary domain control circuit 108. The domain control circuit 108 receives a domain control signal DM-CTL-A, which may be a multi-bit signal, received on input 110. The domain control signal DM-CTL-A indicates whether each of the domains 106(1)-106(4) is activated or deactivated. In response to the indications on the domain control signal DM-CTL-A, the domain control circuit 108 provides an appropriate power on a power rail 112 for each of the activated domains 106(1)-106(4) and activates or deactivates respective clock gate signals CKGT1(1)-CKGT1(4) accordingly.

Although only shown in domains 106(1) and 106(2), each of the domains 106(1)-106(4) may include a clock distribution tree CLKTREE. The clock distribution tree CLKTREE in domain 106(1) is explained as an example. The clock distribution tree CLKTREE in the domain 106(1) receives a system clock signal SYSCLK and the clock gate signal CKGT1(1). When active (e.g., in an ON state indicated by a first voltage level), the clock gate signal CLKGT1(1) gates or blocks distribution of the system clock SYSCLK, shutting off activity in digital circuits in the domain 106(1). In contrast, in response to the clock gate signal CKGT1(1) being deactivated (e.g., in an OFF state indicated by a second voltage level), the clock distribution tree CLKTREE distributes a domain clock CLK-D1(1) to each of a plurality of digital circuits 114(1)-114(4) in domain 106(1). The domain 106(2) receives the clock gate signal CKGT1(2) and, although not shown, also receives the system clock SYSCLK. The clock distribution tree CLKTREE in the domain 106(2) distributes a domain clock CLK-D1(2) to interface circuits 116A if the clock gate signal CKGT1(2) is deactivated. The domains 106(3) and 106(4), which include clock distribution trees CLKTREE, receive clock gate signals CKGT1(1) and CKGT1(2), respectively, and the system clock SYSCLK (not shown).

The IC 102B includes domains 118(1)-118(5) and a domain control circuit 120. The domain 118(1) includes digital circuits 124(1)-124(3). The domain control circuit 120 may correspond to the domain control circuit 108 in IC 102A and may be programmed or modified according to the IC 102B. Each domain 118(1)-118(5) is coupled to a power rail 122 driven by domain control circuit 120. The domains 118(1)-118(5) receive clock gate signals CKGT2(1)-CKGT2(5) from the domain control circuit 120 to control the distribution of the system clock SYSCLK. The domain control circuit 120 receives indications of whether each of the domains 118(1)-118(5) is activated or deactivated in a domain control signal DM-CTL-B and determines a state of the clock gate signals CKGT2(1)-CKGT2(5).

The domain 118(2) in the IC 102B includes an interface circuit 116B, which, when activated, communicates to interface circuit 116A in the IC 102A. When there is no communication between the interface circuit 116A and the interface circuit 116B, domain control circuit 108 may activate the clock gate signal CLKGT1(2) to stop the system clock SYSCLK from being distributed to the interface circuit 116A and the domain control circuit 120 may activate the clock gate signal CLKGT2(2) to stop the system clock SYSCLK from being distributed to the interface circuit 116B. In this state, the domains 106(2) and 118(2) are not operational, so their power consumption may be reduced to only leakage currents. Thus, less power is drawn from the power rails 112 and 122, and their respective drive capabilities may be reduced. When communication is again needed between IC 102A and IC 102B, the clock gate signals CLKGT1(2) and CLKGT2(2) are deactivated, which activates the interface circuits 116A and 116B to perform communication.

As explained further with reference to FIG. 2, the domain control circuits 108 and 120 reduce voltage droops on the power rails 112 and 122 when communication restarts between the IC 102A and the IC 102B. Reducing voltage droop in this manner includes increasing drive capabilities on the power rails 112 and 122 before deactivating the clock gate signals CLKGT1(2) and CLKGT2(2). When the clock gate signal CLKGT1(2) is deactivated, the domain clock signal DCLK1 is distributed in domain 106(2) to turn on (activate) the interface circuit 116A, and a domain clock signal DCLK2 is distributed in the domain 118(2) to turn on the interface circuit 116B. Providing an increased drive capability on the power rails 112 and 122 prior to activating the domain clock signals reduces a sudden drop (droop) in voltage when the domains 106(2) and 118(2) become active and start drawing current.

FIG. 2 is a schematic diagram of a domain control circuit 200 corresponding to the domain control circuits 108 and 120 in FIG. 1, which reduce a voltage droop upon activation of a first domain of an IC. In this context, "activation" of the first domain indicates that power is provided to the first domain and a clock signal provided to the first domain is cycling, and "deactivation" indicates that cycling of a clock signal is stopped and may further indicate that power for the first domain is no longer provided. In the following description of FIG. 2, references to a first domain and an IC, which are not shown in FIG. 2, may correspond to, for example, one of the domains 106(1)-106(4) in the IC 102A in FIG. 1. The domain control circuit 200 includes a power regulator 202 and a sequencing circuit 204. The power regulator 202 includes a regulator circuit 206 to provide power at a supply voltage $V_{DD}$ on a power rail 208, which may be coupled to multiple domains within an IC, such as the domains 106(1)-106(4) in IC 102A FIG. 1. In this example, the regulator circuit 206 is not controlled by the sequencing circuit 204 because the regulator circuit 206 provides power for a domain that is "always-on."

The term "always-on" in reference to a domain in this context indicates that a domain is active while power is provided to the power regulator 202 and is not deactivated by the sequencing circuit 204. For example, when an electronic device containing an IC is put into a sleep-mode or low-power mode (e.g., by power-saving software), domains within the IC may be deactivated, but at least some circuits in the IC need to remain active to recognize a wake-up signal or wake-up command to return to normal operation. Thus, at least one domain in the IC remains always-on (e.g., with active clock signals). Such domain may be small to keep power consumption to a minimum during the sleep mode or may include circuits that remain active for other reasons in a low-power mode. In some examples, the clocks in an "always-on" domain in an IC may be shut off even while power is provided to the IC.

The sequencing circuit 204 may be provided to control clocks and provide power to the rest of the domains in an IC to reduce voltage droops. The power regulator 202 in FIG. 2 includes regulator circuits 210(1)-210(N) for providing current drive capability to the power rail 208 for the power demands of a domain, which is subsequently referred to herein as the first domain DM1 but is not shown in FIG. 2. For example, the first domain DM1 could be any of the domains 106(1)-106(4) in FIG. 1. Power is provided to the first domain DM1 and to the always-on domain by the power rail 208. The regulator circuits 210(1)-210(N) may be activated in addition to the regulator circuit 206 because the regulator circuit 206 provides current capacity that is only sufficient to meet the power needs of the always-on domain. The regulator circuits 210(1)-210(N) are activated to provide the additional current carrying capacity necessary for the first domain DM1. The sequencing circuit 204 receives a domain control signal DM-CTL on an input 212, indicating whether a first domain DM1 is to be activated or deactivated. The domain control signal DM-CTL may be provided to the domain control circuit 200 from an always-on domain, which stays active while the first domain DM1 is deactivated. Alternatively, the domain control signal DM-CTL may be provided to the domain control circuit 200 from an input to the IC. The domain control signal DM-CTL is activated to activate the first domain DM1. An example of the domain control signal DM-CTL is shown in the timing diagram 214 in FIG. 2. The timing diagram 214 indicates a state of the domain control signal DM-CTL as a binary signal, which may be based on a voltage level provided to the input 212. In response to activation of the domain control signal DM-CTL, the sequencing circuit 204 first generates a power control signal 216 to control the regulator circuits 210(1)-210(N) to supply power on the power rail 208 for the first domain DM1. After generating the power control signal 216 to control the regulator circuits 210(1)-210(N) to supply power, the sequencing circuit 204 generates a clock gate signal 218 in a deactivated state to activate the first domain DM1. In other words, in response to the domain control signal DM-CTL indicating activation of the first domain DM1, at least one of the regulator circuits 210(1)-210(N) is first turned on before activation of clocks in the first domain DM1, which may cause a power rail voltage $V_{PWR}$ on the power rail 208 to increase. After a predetermined delay interval, the clock gate signal 218 is deactivated to activate a domain clock in the first domain DM1. In response to the clock gate signal 218 being deactivated, the first domain DM1 begins to consume power. In an IC without the domain control circuit 200, a sudden demand for power on a power rail 208 may cause a power rail voltage to decrease below a threshold level at which performance may be degraded and/or errors may occur. However, in an IC including the domain control circuit 200, because the clock gate signal 218 is deactivated after the regulator circuits 210(1)-210(N) are activated, a power rail voltage $V_{PWR}$ on the power rail 208 is at an increased level when power consumption surges in the first domain DM1. That is, the sequencing circuit 204 generates the clock gate signal 218 in the deactivated state after the power rail voltage $V_{PWR}$ increases in response to at least one of the regulator circuits 210(1)-210(N) supplying power to the first domain DM1. Consequently, the sudden power demand merely causes the voltage $V_{PWR}$ to drop briefly to a voltage slightly below a voltage threshold before returning the power rail voltage $V_{PWR}$ to a normal level.

The first domain DM1 is also deactivated based on the domain control signal DM-CTL. In response to the domain control signal DM-CTL indicating deactivation of the first domain DM1, the sequencing circuit 204 generates the clock gate signal 218 in an active state, which will deactivate the domain clock signal in the first domain DM1. After generating the clock gate signal 218 in the deactivated state, the sequencing circuit 204 generates the power control signal 216 to control the regulator circuits 210(1)-210(N) to stop supplying power on the power rail 208 for the first domain DM1. Stopping the supply of power to the first domain DM1 is delayed for a predetermined delay interval after generating the clock gate signal 218 in the deactivated state to ensure that operation of the first domain DM1 has ceased before power is cut off. If power is cut off from the first domain DM1 before a domain clock stops, the power rail voltage $V_{PWR}$ may drop below a threshold, which could cause data errors.

The power control signal 216 generated by the sequencing circuit 204 can activate and deactivate the regulator circuits 210(1)-210(N). In some examples, all of the regulator circuits 210(1)-210(N) are activated to supply power to the power rail 208 for the first domain DM1 in response to the power control signal 216. In FIG. 2, the regulator circuits 210(1)-210(N) are coupled in parallel to each other between a supply voltage node 220 and the power rail 208. A capacitor 222 is coupled between the power rail 208 and ground GND. The domain control circuit 200 can accommodate a first domain DM1 with a maximum power requirement that does not exceed a power level provided by all of the regulator circuits 210(1)-210(N). In some examples, in which the power requirement of the first domain DM1 is lower, any number (e.g., from 1 to N) of the regulator circuits 210(1)-210(N) may be activated by a regulator control circuit 224. The regulator control circuit 224 controls the number of the regulator circuits 210(1)-210(N) that are activated to power the first domain DM1 based on a power level signal DM1-PWR received on an input 226. Although the regulator control circuit 224 is shown as part of the power regulator 202 in FIG. 2, the regulator control circuit may be external to power regulator 202 and may be included in the sequencing circuit 204. The power level signal DM1-PWR indicates the number of the regulator circuits 210(1)-210(N) to be activated in response to the power control signal 216 being activated. The flexibility provided by the domain control circuit 200 in this regard may be beneficial when a total power consumption of the first domain DM1 is not known in advance or may be variable. For example, in a domain including an instruction processing circuit that consumes power at rates that vary according to the instructions being executed and their position in a pipeline, the power level signal DM1-PWR may be adjusted dynamically as instructions enter the pipeline to synchronize the delivery of power to the domain with the particular instructions at particular locations in the pipeline.

Each of the regulator circuits 210(1)-210(N) includes a first transistor 228 configured to couple the supply voltage node 220 to an intermediate node 230 based on regulator control signals 232(1)-232(N) generated in the regulator control circuit 224. Each of the regulator circuits 210(1)-210(N) also includes a second transistor 234 to couple the intermediate node 230 to the power rail 208 based on the power rail voltage $V_{PWR}$.

The sequencing circuit 204 includes a delay circuit 236, including one or more buffer circuits 238(1)-238(X) coupled in series, where X is selected based on a delay of each of the buffer circuits 238(1)-238(X) and a predetermined delay interval. The predetermined delay interval is an amount of time by which generation of the power control signal 216 will be delayed after generation of the clock gate signal 218, or vice versa. The delay circuit 236 receives the domain control signal DM-CTL and generates a delayed domain control signal DM-CTL-DLY, which is the domain control signal DM-CTL adjusted in time (i.e., delayed) by the predetermined delay interval provided by the delay circuit 236.

The sequencing circuit 204 includes a first multiplexor 240 and a second multiplexor 242. The first multiplexor 240 generates the power control signal 216 to control at least one of the regulator circuits 210(1)-210(N) to supply power for the first domain DM1. The power control signal 216 is generated by the first multiplexor 240 in response to the domain control signal DM-CTL being activated (e.g., binary "1" indicated by the supply voltage $V_{DD}$) and the delayed domain control signal DM-CTL-DLY also being activated. The second multiplexor 242 generates the clock gate signal 218 to deactivate the clock signal in the first domain DM1 in two situations. A first situation in which the clock gate signal 218 is activated is in response to the domain control signal DM-CTL being activated and the delayed domain control signal DM-CTL-DLY being deactivated (e.g., binary "0" indicated by a low voltage, ground or $V_{SS}$). This first situation occurs after the domain control signal DM-CTL has been activated, but this change of state has not propagated through the delay circuit 236. A second situation in which the clock gate signal 218 is activated is in response to the delayed domain control signal DM-CTL-DLY being activated. In this way, when the first domain DM1 is to be turned off, which may also be referred to as shut-down or put into sleep mode, the domain clock to the first domain DM1 is deactivated by activating the clock gate signal 218, and after the predetermined delay interval, the power control signal 216 is activated to stop supplying power for the first domain DM1 on the power rail 208.

This is shown in the timing diagram 214, which shows sequences of the domain control signal DM-CTL, the clock gate signal 218, and the power control signal 216 as the first domain DM1 is deactivated. At time T1, the domain control signal DM-CTL is activated (e.g., transitions from "0" to "1"). In response to the transition of the domain control signal DM-CTL and a brief propagation delay through the second multiplexor 242, the clock gate signal 218 transitions at time T2 to deactivate the domain clock in the first domain DM1. The transition of the domain control signal DM-CTL also propagates through the delay circuit 236 and the first multiplexor 240 and causes the power control signal 216 to transition, at time T3, to deactivate any active ones of the regulator circuits 210(1)-210(N). The first domain DM1 remains dormant while the domain control signal DM-CTL remains active until time T4, at which time the domain control signal DM-CTL transitions again (e.g., from "1" back to "0") to turn on the first domain DM1. The power control signal 216 is activated at time T5 to turn on a number M of the regulator circuits 210(1)-210(N), where M depends on the power level signal DM-PWR1 received in the regulator control circuit 224. Also, the transition of the domain control signal DM-CTL propagates through the delay circuit 236 for the predetermined delay interval, and the clock gate signal 218 is deactivated at time T6 to turn on the domain clock in the first domain DM1.

As shown in FIG. 2, the power regulator 202 may also include regulator circuits 250(1)-250(Y), which may be one or more regulator circuits coupled in parallel, corresponding to the regulator circuits 210(1)-210(N). The regulator circuit 250(1)-250(Y) may provide power on the power rail 208 for a second domain that is coupled to the power rail 208. To control the regulator circuit 250, the power regulator includes a regular control circuit 252, which receives a second domain power level signal DM2-PWR. In this regard, the domain control circuit 200 may further include a second sequencing circuit 254 to control the second domain DM1, operating in the same manner as the sequencing circuit 204. The second sequencing circuit 252 may receive a second domain control signal DM2-CTL and generate a second power control signal 256 to activate and deactivate the second domain. Alternatively, the second sequencing circuit 252 may receive the domain control signal DM-CTL. In this regard, the domain control signal DM-CTL may be a multi-bit signal to separately control the sequencing circuit 204 and the second sequencing circuit 252. In some examples, the domain control circuit 200 may include additional sequencing circuits and additional corresponding regulator circuits in the power regulator 202 for controlling additional domains of an IC.

Figure 3:
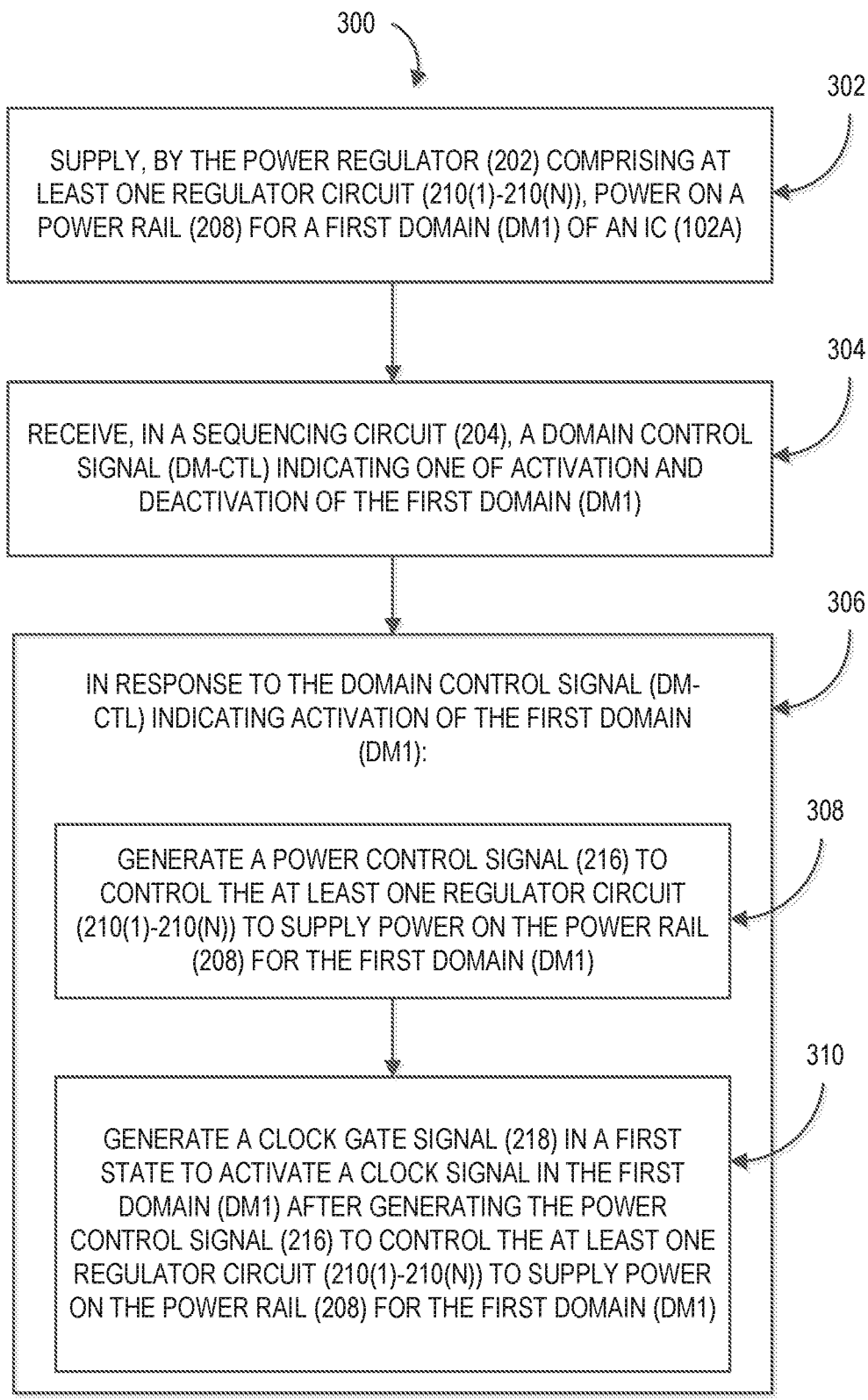
FIG. 3 is a flowchart illustrating a method of reducing a voltage droop with the domain control circuit in FIG. 1.

FIG. 3 is a flowchart of a method 300 of controlling a first domain DM1 of an IC 102A. The method includes supplying, by the power regulator 202 comprising at least one regulator circuit 210(1)-210(N), power on a power rail 208 for a first domain DM1 of an IC 102A (block 302). The method includes receiving, in a sequencing circuit 204, a domain control signal DM-CTL indicating one of activation and deactivation of the first domain DM1 (block 304). The method further includes, in response to the domain control signal DM-CTL indicating activation of the first domain DM1 (block 306), generating a power control signal 216 to control the at least one regulator circuit 210(1)-210(N) to supply power on the power rail 208 for the first domain DM1 (block 308), and generating a clock gate signal 218 in a first state to activate a clock signal in the first domain DM1 after generating the power control signal 216 to control the at least one regulator circuit 210(1)-210(N) to supply power on the power rail 208 for the first domain DM1 (block 310).

Figure 4:
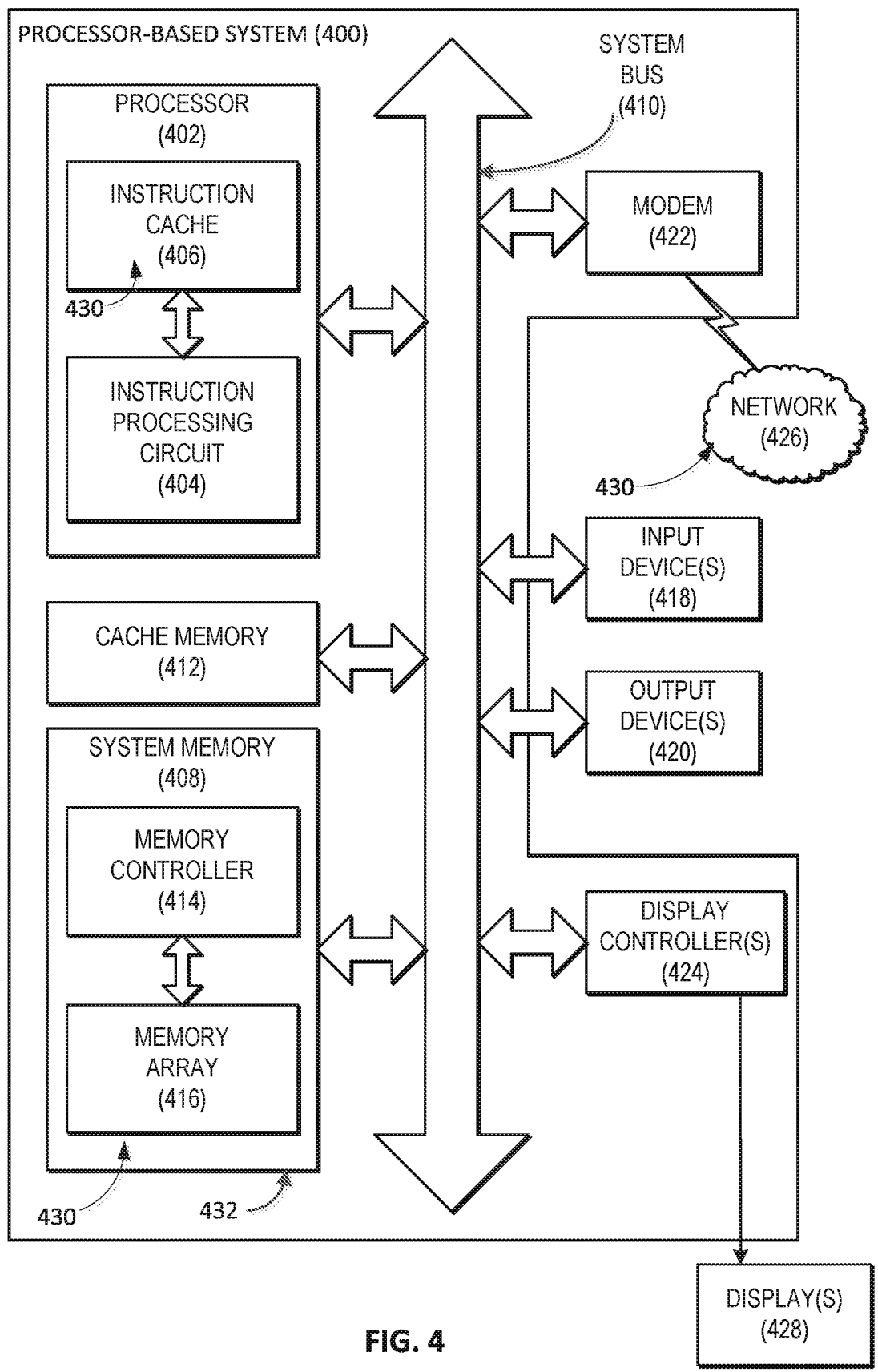
FIG. 4 is a block diagram of an exemplary processor-based system, including a domain control circuit including, a power regulator, and a sequencing circuit to reduce a voltage droop upon activation of a domain of an IC.

FIG. 4 is a block diagram of an exemplary processor-based system 400 that includes a processor 402 (e.g., a microprocessor) that includes an instruction processing circuit 404. The processor-based system 400 may be a circuit or circuits included in an electronic board card, such as a printed circuit board (PCB), a server, a personal computer, a desktop computer, a laptop computer, a personal digital assistant (PDA), a computing pad, a mobile device, or any other device, and may represent, for example, a server, or a user's computer. In this example, the processor-based system 400 includes the processor 402. The processor 402 represents one or more general-purpose processing circuits, such as a microprocessor, central processing unit, or the like. More particularly, the processor 402 may be an EDGE instruction set microprocessor or other processor implementing an instruction set that supports explicit consumer naming for communicating produced values resulting from execution of producer instructions. The processor 402 is configured to execute processing logic in instructions for performing the operations and steps discussed herein. In this example, the processor 402 includes an instruction cache 406 for temporary, fast access memory storage of instructions accessible by the instruction processing circuit 404. Fetched or prefetched instructions from a memory, such as a main memory 408, over a system bus 410, are stored in the instruction cache 406. Data may be stored in a cache memory 412 coupled to the system bus 410 for low-latency access by the processor 402. The instruction processing circuit 404 is configured to process instructions fetched into the instruction cache 406 and process the instructions for execution.

The processor 402 and the main memory 408 are coupled to the system bus 410 and can intercouple peripheral devices included in the processor-based system 400. As is well known, the processor 402 communicates with these other devices by exchanging address, control, and data information over the system bus 410. For example, the processor 402 can communicate bus transaction requests to a memory controller 414 in the main memory 408 as an example of a slave device. Although not illustrated in FIG. 4, multiple system buses 410 could be provided; wherein each system bus 410 constitutes a different fabric. In this example, the memory controller 414 is configured to provide memory access requests to a memory array 416 in the main memory 408. The memory array 416 is comprised of an array of storage bit cells for storing data. The main memory 408 may be a read-only memory (ROM), flash memory, dynamic random-access memory (DRAM), such as synchronous DRAM (SDRAM), etc., and/or static memory (e.g., flash memory, SRAM, etc.), as non-limiting examples.

Other devices can be connected to the system bus 410. As illustrated in FIG. 4, these devices can include the main memory 408, one or more input device(s) 418, one or more output device(s) 420, a modem 422, and one or more display controllers 424, as examples. The input device(s) 418 can include any type of input device, including but not limited to input keys, switches, voice processors, etc. The output device(s) 420 can include any type of output device, including but not limited to audio, video, other visual indicators, etc. The modem 422 can be any device configured to allow exchange of data to and from a network 426. The network 426 can be any type of network, including but not limited to a wired or wireless network, a private or public network, a local area network (LAN), a wireless local area network (WLAN), a wide area network (WAN), a BLUETOOTH™ network, and the Internet. The modem 422 can be configured to support any type of communications protocol desired. The processor 402 may also be configured to access the display controller(s) 424 over the system bus 410 to control information sent to one or more displays 428. The display(s) 428 can include any type of display, including but not limited to a cathode ray tube (CRT), a liquid crystal display (LCD), a plasma display, etc.

The processor-based system 400 in FIG. 4 may include a set of instructions 430 to be executed by the processor 402 for any application desired according to the instructions. The instructions 430 may be stored in the main memory 408, processor 402, and/or instruction cache 406 as examples of a non-transitory computer-readable medium 432. The instructions 430 may also reside, completely or at least partially, within the main memory 408 and/or within the processor 402 during their execution. The instructions 430 may further be transmitted or received over the network 426 via the modem 422, such that the network 426 includes computer-readable medium 432.

Any of the circuits in the processor-based system 400 may include a domain control circuit 200, as shown in FIG. 2, for controlling clocking and power to a domain to reduce voltage droop.

While the computer-readable medium 432 is shown in an exemplary embodiment to be a single medium, the term "computer-readable medium" should be taken to include a single medium or multiple media (e.g., a centralized or distributed database and/or associated caches and servers) that store the one or more sets of instructions. The term "computer-readable medium" shall also be taken to include any medium that is capable of storing, encoding, or carrying a set of instructions for execution by the processing device and that causes the processing device to perform any one or more of the methodologies of the embodiments disclosed herein. The term "computer-readable medium" shall accordingly be taken to include, but not be limited to, solid-state memories, optical medium, and magnetic medium.

The embodiments disclosed herein include various steps. The steps of the embodiments disclosed herein may be formed by hardware components or may be embodied in machine-executable instructions, which may be used to cause a general-purpose or special-purpose processor programmed with the instructions to perform the steps. Alternatively, the steps may be performed by a combination of hardware and software.

The embodiments disclosed herein may be provided as a computer program product or software that may include a machine-readable medium (or computer-readable medium) having stored thereon instructions, which may be used to program a computer system (or other electronic devices) to perform a process according to the embodiments disclosed herein. A machine-readable medium includes any mechanism for storing or transmitting information in a form readable by a machine (e.g., a computer). For example, a machine-readable medium includes a machine-readable storage medium (e.g., ROM, random access memory ("RAM"), a magnetic disk storage medium, an optical storage medium, flash memory devices, etc.); and the like.

Unless specifically stated otherwise and as apparent from the previous discussion, it is appreciated that throughout the description, discussions utilizing terms such as "processing," "computing," "determining," "displaying," or the like refer to the action and processes of a computer system, or similar electronic computing device, that manipulates and transforms data and memories represented as physical (electronic) quantities within the computer system's registers into other data similarly represented as physical quantities within the computer system memories or registers or other such information storage, transmission, or display devices.

The algorithms and displays presented herein are not inherently related to any particular computer or other apparatus. Various systems may be used with programs in accordance with the teachings herein, or it may prove convenient to construct more specialized apparatuses to perform the required method steps. The required structure for a variety of these systems will appear from the description above. In addition, the embodiments described herein are not described with reference to any particular programming language. It will be appreciated that a variety of programming languages may be used to implement the teachings of the embodiments as described herein.

Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The components of the distributed antenna systems described herein may be employed in any circuit, hardware component, integrated circuit (IC), or IC chip, for example. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends on the particular application, design choices, and/or design constraints imposed on the overall system. Skilled artisans may implement the described functionality in varying ways for each particular application, but such implementation decisions should not be interpreted as causing a departure from the scope of the present embodiments.

The various illustrative logical blocks, modules, and circuits described in connection with the embodiments disclosed herein may be implemented or performed with a processor, a Digital Signal Processor (DSP), an Application Specific Integrated Circuit (ASIC), a Field Programmable Gate Array (FPGA), or other programmable logic device, a discrete gate or transistor logic, discrete hardware components, or any combination thereof designed to perform the functions described herein. Furthermore, a controller may be a processor. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The embodiments disclosed herein may be embodied in hardware and in instructions that are stored in hardware and may reside, for example, in RAM, flash memory, ROM, Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from and write information to the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. Those of skill in the art will also understand that information and signals may be represented using any of a variety of technologies and techniques. For example, data, instructions, commands, information, signals, bits, symbols, and chips that may be referenced throughout the above description may be represented by voltages, currents, electromagnetic waves, magnetic fields, optical fields or particles, or any combination thereof.

Unless otherwise expressly stated, it is in no way intended that any method set forth herein be construed as requiring that its steps be performed in a specific order. Accordingly, where a method claim does not actually recite an order to be followed by its steps, or it is not otherwise specifically stated in the claims or descriptions that the steps are to be limited to a specific order, it is in no way intended that any particular order be inferred.

It will be apparent to those skilled in the art that various modifications and variations can be made without departing from the spirit or scope of the invention. Since modifications, combinations, sub-combinations, and variations of the disclosed embodiments incorporating the spirit and substance of the invention may occur to persons skilled in the art, the invention should be construed to include everything within the scope of the appended claims and their equivalents.

What is claimed is:

1. A domain control circuit, comprising:
   a power regulator comprising a plurality of regulator circuits each configured to supply power on a power rail for a first domain of an integrated circuit (IC); and
   a sequencing circuit configured to:
   receive a domain control signal indicating one of activation and deactivation of the first domain; and
   in response to the domain control signal indicating activation of the first domain:
   generate a power control signal to control the plurality of regulator circuits to supply power on the power rail for the first domain; and
   generate a clock gate signal in a first state to activate a clock signal in the first domain in response to the power control signal being generated to control the plurality of regulator circuits to supply power on the power rail for the first domain,
   wherein the power regulator, further comprises a regulator control circuit configured to:
   receive a power level signal; and
   control a first plurality of regulator circuits of the plurality of regulator circuits to supply power in parallel to the power rail in response to the power control signal and the power level signal indicating a number of regulator circuits of the first plurality of regulator circuits to be activated.

2. The domain control circuit of claim 1, wherein the sequencing circuit is further configured to generate the clock gate signal in the first state after generating the power control signal to control the plurality of regulator circuits to supply power on the power rail for the first domain.

3. The domain control circuit of claim 1, wherein the sequencing circuit is further configured to generate the clock gate signal in the first state after a voltage on the power rail increases in response to the plurality of regulator circuits supplying power for the first domain.

4. The domain control circuit of claim 1, each of the plurality of regulator circuits comprising:
a first transistor configured to couple a supply voltage node to an intermediate node based on the regulator control circuit; and
a second transistor configured to couple the intermediate node to the power rail based on a voltage on the power rail.

5. The domain control circuit of claim 1, wherein the sequencing circuit is further configured to, in response to the domain control signal indicating deactivation of the first domain:
generate the clock gate signal in a second state to deactivate the clock signal in the first domain; and
generate the power control signal to control the plurality of regulator circuits to stop supplying power on the power rail for the first domain in response to generating the clock gate signal in the second state.

6. The domain control circuit of claim 5, wherein the sequencing circuit is further configured to generate the power control signal to control the plurality of regulator circuits to stop supplying power on the power rail for the first domain at a predetermined delay interval after generating the clock gate signal in the second state.

7. The domain control circuit of claim 1, the sequencing circuit further comprising:
a delay circuit comprising at least one buffer circuit configured to:
receive the domain control signal; and
generate a delayed domain control signal comprising the domain control signal delayed by a predetermined delay interval;
a first multiplexor configured to control the plurality of regulator circuits to supply power for the first domain in response to the domain control signal comprising a first state and the delayed domain control signal comprising the first state; and
a second multiplexor configured to generate the clock gate signal to deactivate the clock signal in the first domain in response to:
the domain control signal comprising the first state and the delayed domain control signal comprising a second state; and
the delayed domain control signal comprising the first state.

8. The domain control circuit of claim 1, the power regulator further comprising at least one always-on regulator circuit for supplying power on the power rail for an always-on domain.

9. The domain control circuit of claim 1, further comprising:
a second power regulator comprising a second plurality of regulator circuits configured to supply power on the power rail for a second domain of the IC;

a second sequencing circuit configured to:
receive a second domain control signal indicating one of activation and deactivation of the second domain:
in response to the second domain control signal indicating activation of the second domain:
generate a second power control signal to control the second plurality of regulator circuits to supply power on the power rail for the second domain; and
generate a second clock gate signal in the first state to activate a second clock signal in the second domain after generating the second power control signal to control the second plurality of regulator circuits to supply power on the power rail for the second domain.

10. A system comprising an integrated circuit (IC) comprising:
a first domain comprising a chip-to-chip interface circuit;
a domain control circuit, comprising:
a power regulator comprising a plurality of regulator circuits configured to supply power on a power rail for a first domain of an integrated circuit (IC); and
a sequencing circuit configured to:
receive a domain control signal indicating one of activation and deactivation of the first domain; and
in response to the domain control signal indicating activation of the first domain:
generate a power control signal to control the plurality of regulator circuits to supply power on the power rail for the first domain; and
generate a clock gate signal in a first state to activate a clock signal in the first domain after generating the power control signal to control the plurality of regulator circuits to supply power on the power rail for the first domain;
wherein the power regulator, further comprises a regulator control circuit configured to:
receive a power level signal; and
control a first plurality of regulator circuits of the plurality of regulator circuits to supply power in parallel to the power rail in response to the power control signal and the power level signal indicating a number of regulator circuits of the first plurality of regulator circuits to be activated; and
a clock distribution circuit configured to:
receive the clock gate signal;
receive a system clock signal; and
distribute the system clock signal to the first domain based on the clock gate signal.

11. The system of claim 10, the IC further comprising an always-on domain configured to provide the domain control signal to the sequencing circuit.

12. The system of claim 11, further comprising:
a second IC, comprising:
a second power regulator comprising a second plurality of regulator circuits configured to supply power on a second power rail for a second domain;
a second sequencing circuit configured to:
receive a second domain control signal indicating one of activation and deactivation of the second domain; and
in response to the second domain control signal indicating activation of the second domain:
generate a second power control signal to control the second plurality of regulator circuits to supply power on the second power rail for the second domain; and generate a second clock gate signal in the first state to activate a second clock signal in the second domain after generating the second power control signal to control the second plurality of regulator circuits to supply power on the second power rail for the second domain.

13. A method of controlling a first domain of an integrated circuit, comprising:
supplying, by a power regulator comprising a plurality of regulator circuits, power on a power rail for a first domain of an integrated circuit (IC);
receiving, in a sequencing circuit, a domain control signal indicating one of activation and deactivation of the first domain;
in response to the domain control signal indicating activation of the first domain:
generating a power control signal to control the plurality of regulator circuits to supply power on the power rail for the first domain; and
generating a clock gate signal in a first state to activate a clock signal in the first domain in response to generating the power control signal to control the plurality of regulator circuits to supply power on the power rail for the first domain;
receiving, in the power regulator, a power level signal; and
controlling a first plurality of the plurality of regulator circuits to supply power in parallel to the power rail in response to the power control signal and the power level signal indicating a number of the first plurality of regulator circuits to be activated.

14. The method of claim 13, further comprising generating the clock gate signal in the first state after generating the power control signal to control the plurality of regulator circuits to supply power on the power rail for the first domain.

15. The method of claim 13, further comprising generating the clock gate signal in the first state after a voltage on the power rail increases in response to the plurality of regulator circuits supplying power for the first domain.

16. The method of claim 13, further comprising, in response to the domain control signal indicating deactivation of the first domain:
generating the clock gate signal in a second state to deactivate the clock signal in the first domain; and
generating the power control signal to control the plurality of regulator circuits to stop supplying power on the power rail for the first domain after generating the clock gate signal in the second state.

17. The method of claim 16, further comprising generating the power control signal to control the plurality of regulator circuits to stop supplying power on the power rail for the first domain a predetermined delay interval after generating the clock gate signal in the second state.

18. The method of claim 13, further comprising:
receiving, in a delay circuit, the domain control signal; and
generating a delayed domain control signal comprising the domain control signal delayed by a predetermined delay interval;
controlling the plurality of regulator circuits to supply power for the first domain in response to the domain control signal comprising a first state and the delayed domain control signal comprising the first state; and
generating the clock gate signal to deactivate the clock signal in the first domain in response to:
the domain control signal comprising the first state and the delayed domain control signal comprising a second state; and
the delayed domain control signal comprising the first state.

19. The method of claim 18, further comprising, in each of the plurality of regulator circuits:
coupling a supply voltage node to a first node in response to the power control signal and the power level signal; and
coupling the first node to the power rail based on a voltage on the power rail.

20. The method of claim 13, further comprising providing, by an always-on domain, the domain control signal to the domain control circuit.

21. A processor system, comprising:
a memory configured to store instructions; and
a processing circuit configured to, in response to executing instructions stored in the memory:
control a power regulator to supply power on a power rail for a first domain of an integrated circuit (IC), the power regulator comprising a plurality of regulator circuits; and
control a sequencing circuit to:
receive a domain control signal indicating one of activation and deactivation of the first domain; and
in response to the domain control signal indicating activation of the first domain:
generate a power control signal to control the plurality of regulator circuits to supply power on the power rail for the first domain; and
generate a clock gate signal in a first state to activate a clock signal in the first domain in response to the power control signal being generated to control the plurality of regulator circuits to supply power on the power rail for the first domain;
wherein:
the power regulator comprises at least one regulator circuit; and
the processing circuit is further configured to control the power regulator to:
receive a power level signal; and
control a first plurality of the plurality of regulator circuits to supply power in parallel to the power rail in response to the power control signal and the power level signal indicating a number of the first plurality of regulator circuits to be activated.

* * * * *